United States Patent
Yamamoto

(10) Patent No.: US 10,381,444 B2
(45) Date of Patent: Aug. 13, 2019

(54) MANUFACTURING METHOD OF SEMICONDUCTOR DEVICE

(71) Applicant: Renesas Electronics Corporation, Tokyo (JP)

(72) Inventor: Youichi Yamamoto, Ibaraki (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 4 days.

(21) Appl. No.: 15/791,605

(22) Filed: Oct. 24, 2017

(65) Prior Publication Data

US 2018/0145137 A1 May 24, 2018

(30) Foreign Application Priority Data

Nov. 18, 2016 (JP) .................. 2016-225059

(51) Int. Cl.
*H01L 21/22* (2006.01)
*H01L 29/10* (2006.01)
(Continued)

(52) U.S. Cl.
CPC ........ *H01L 29/1095* (2013.01); *H01L 21/046* (2013.01); *H01L 21/0465* (2013.01);
(Continued)

(58) Field of Classification Search
CPC ......... H01L 21/02216; H01L 21/02274; H01L 21/02126; H01L 21/3122; H01L 21/76834; H01L 21/31612; H01L 21/76829; H01L 21/76831; H01L 21/02164; H01L 21/022; H01L 21/31116; H01L 21/76802; H01L 2924/0002; H01L 21/02214; H01L 21/02282; H01L 21/3121; H01L 21/31633; H01L 2924/00; H01L 21/02115; H01L 21/3105; H01L 21/3144; H01L 21/3145; H01L 21/31695; H01L 21/3185; H01L 21/321; H01L 21/32136; H01L 21/76801; H01L 21/76826; H01L 21/76832; H01L 21/76837; H01L 21/76838; H01L 21/7685; H01L 21/76867; H01L 21/76886; H01L 23/5329; H01L 23/53295; H01L 21/046; H01L 21/0465; H01L 21/0475; H01L 21/324; H01L 29/1095; H01L 29/1608; H01L 29/4236; H01L 29/66068; H01L 29/7397; H01L 29/7813; C23C 16/401; C23C 16/509; C23C 16/308; C23C 16/30; C23C 16/402; C23C 16/5096;
(Continued)

(56) References Cited

U.S. PATENT DOCUMENTS 7,682,991 B2 * 3/2010 Kawada .............. H01L 21/0475 438/796
2007/0015373 A1 * 1/2007 Cowen .................. H01L 21/046 438/758

FOREIGN PATENT DOCUMENTS

JP 2006-108243 A 4/2006
JP 5509520 B2 6/2014

* cited by examiner

*Primary Examiner* — Robert G Bachner
(74) *Attorney, Agent, or Firm* — McDermott Will & Emery LLP

(57) ABSTRACT

To improve the performance of a semiconductor device, there is provided with a manufacturing method of a semiconductor device including a step of removing an oxide film formed on the surface of a silicon carbide substrate including the inner wall of a trench, before forming the hydrogen annealing.

13 Claims, 9 Drawing Sheets

(51) Int. Cl.
*H01L 21/04* (2006.01)
*H01L 29/16* (2006.01)
*H01L 29/423* (2006.01)
*H01L 29/66* (2006.01)
*H01L 21/324* (2006.01)
*H01L 29/739* (2006.01)
*H01L 29/78* (2006.01)

(52) U.S. Cl.
CPC ........ *H01L 21/0475* (2013.01); *H01L 21/324* (2013.01); *H01L 29/1608* (2013.01); *H01L 29/4236* (2013.01); *H01L 29/66068* (2013.01); *H01L 29/7397* (2013.01); *H01L 29/7813* (2013.01)

(58) Field of Classification Search
CPC .... D07B 2205/2042; D07B 2205/3017; D07B 2801/10; D07B 2801/16; D07B 2801/18; D07B 1/025; D07B 2201/2012; D07B 2201/2044; D07B 2201/2082; C01D 15/08
See application file for complete search history.

MANUFACTURING METHOD OF SEMICONDUCTOR DEVICE

CROSS-REFERENCE TO RELATED APPLICATIONS

The disclosure of Japanese Patent Application No. 2016-225059 filed on Nov. 18, 2016 including the specification, drawings and abstract is incorporated herein by reference in its entirety.

BACKGROUND

The invention relates to a manufacturing method of a semiconductor device and particularly, to a technique effectively applied to a manufacturing method of a semiconductor device using, for example, a silicon carbide substrate.

Japanese Unexamined Patent Application Publication No. 2006-108243 describes a technique such as forming an oxide film on the surface of a trench-formed silicon substrate through ozonation and then, annealing the above in an atmosphere including hydrogen.

Japanese Unexamined Patent Application Publication No. 5509520 describes a technique for rounding the corner of a trench to avoid an electric field from concentrating on the corner of the trench. Specifically, as the technique for rounding the corner of a trench, argon (Ar) or silane ($SiH_4$)/argon (Ar) is used for annealing.

SUMMARY

A dielectric breakdown easily occurs in a power transistor with a gate electrode formed within a trench because an electric field concentrates on the corner (edge portion) of the trench. Therefore, "annealing round" for rounding the corner of a trench is performed to suppress the electric field concentration on the corner of the trench. However, as the result of taking notice of the manufacturing process of a power transistor using silicon carbide (SiC), the inventor et al. has newly found that the "annealing round" increases the surface roughness of the trench. In this case, particularly, the side wall of the trench works as a channel or a path of electrons and when the surface roughness on the side wall of the trench increases, mobility of electrons is deteriorated due to scattering of the electrons. Particularly, in the manufacturing process of the power transistor using the silicon carbide, some idea to perform the "annealing round" without increasing the surface roughness is required.

Other problems and novel characteristics will be apparent from the description of this specification and the attached drawings.

A manufacturing method of a semiconductor device according to one embodiment includes a process of removing an insulating film formed on the surface of a silicon carbide substrate including the inner wall of a trench, before performing hydrogen annealing.

According to one embodiment, the performance of a semiconductor device can be improved.

DETAILED DESCRIPTION

Figure 1B:
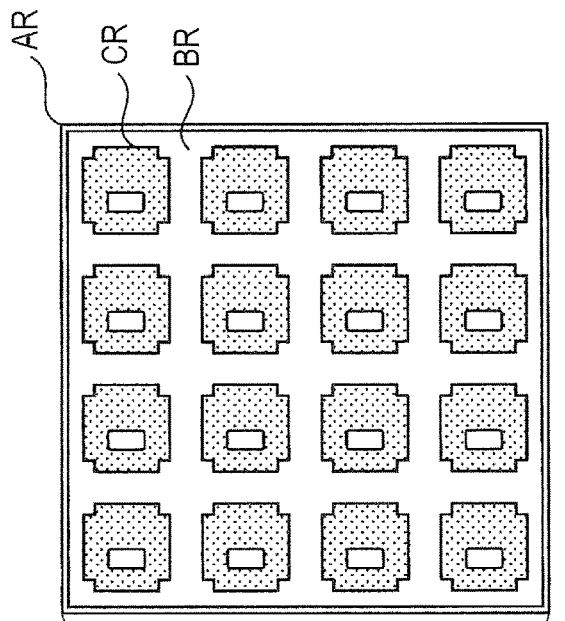
FIG. 1A is a view schematically showing an outer shape of a semiconductor wafer according to an embodiment and FIG. 1B is an enlarged view showing a part thereof in an enlarged way.

In the following embodiments, description will be made by dividing into a plurality of sections or embodiments when necessary for the convenience sake, these are not unrelated to each other but are related to each other such that one covers some or all of modified examples, details, supplemental explanation and so forth of the other unless otherwise clearly specified.

In addition, in the following embodiments, when the number of elements (including the number of units, a numerical value, an amount, a range and the like) is referred to, it is not limited to the specific number but may be more than or not more than the specific number unless otherwise clearly specified and unless otherwise definitely restricted to the specific number in principle.

In addition, in the following embodiments, it is needless to say that the constitutional element (including an element step) is not necessarily indispensable unless otherwise clearly specified and unless otherwise thought to be clearly indispensable in principle.

Likewise, in the following embodiments, when the shapes of the constitutional elements and their positional relationship are referred to, the ones that are substantially approximate or similar to the shapes will be included unless otherwise clearly specified and unless otherwise clearly thought that it is not so in principle. The same also applies to the above-mentioned numerical value and range.

In all of the drawings depicted in order to describe the embodiments, the same numerals are assigned to members having the same functions and repetitive description thereof is omitted. For the sake of easy understanding, hatching may be given even to a plan view.

Explanation of Words

In this specification, "power transistor" means a group of unit transistors (cell transistors) which are coupled in parallel (for example, thousands to hundreds of thousands unit transistors are coupled in parallel) to be able to work as a unit transistor even in a larger allowable current than that of each unit transistor. For example, when the unit transistor works as a switching element, the "power transistor" becomes a switching element adaptable to a larger current than the allowable current of the unit transistor. Especially, in this specification, the word of "power transistor" is used as the upper level of concept including, for example, the both "power MOSFET" and "IGBT".

Consideration of Improvement

In the power transistor as one of a power semiconductor device, a silicon substrate (Si substrate) is heretofore in the mainstream (hereinafter, referred to as Si power transistor). A power transistor (hereinafter, referred to as SiC power transistor) using a silicon carbide substrate (hereinafter, referred to as SiC substrate), however, ensures a higher breakdown voltage and a lower loss, than the Si power transistor. This is because the silicon carbide (SiC) has a larger bandgap than the silicon (Si) and enlarges the dielectric breakdown voltage; as the result, even when thinning a drift layer, a breakdown voltage can be secured. In short, the SiC power transistor can secure a dielectric breakdown voltage even when the drift layer is thinned and the thinned drift layer can reduce the on resistance of the SiC power transistor. Therefore, the SiC power transistor having this advantage is suitable for semiconductor products requiring a high breakdown voltage.

Here, as a device structure of the SiC power transistor, for example, there is a so-called trench gate type power transistor which forms a gate electrode in a trench through a gate insulating film. This trench gate type SiC power transistor passes current in a thickness direction (vertical direction) of a semiconductor chip, hence to improve the integration degree. According to the trench gate type SiC power transistor, the on resistance can be reduced.

However, when a gate voltage is applied to a gate electrode, in the trench where the gate electrode is formed through the gate insulating film, electric field concentration more easily occurs on its edge portion than on its side surface. This is because the electric field concentration occurs more easily in a place (edge portion) shaped in a right angle than in a flat shaped place (side surface). A leak current of a lower voltage is generated in the edge portion of the trench than that of the dielectric voltage of the gate insulating film generally generated in the flat place like the side surface of the trench; as the result, there is a fear of breaking the gate insulting film with a lower voltage than the designed value.

As mentioned above, the trench gate type power transistor with a gate electrode formed within a trench is subject to the electric field concentration on the corner (edge portion) of the trench, hence to cause a dielectric breakdown easily. According to this, "annealing round" is performed to round the corner of a trench, in order to suppress the electric field concentration on the corner of the trench. Taking notice to the manufacturing process of the SiC power transistor, however, the inventor et al. has found that the "annealing round" increases the surface roughness of the trench. Hereinafter, the detail will be described.

For example, in the manufacturing method of the SiC power transistor, at first, after a trench is formed on the surface of the silicon carbide substrate, conductivity type dopant is introduced to the bottom of the trench according to the ion implantation. Thus, a semiconductor region with the conductivity type dopant introduced to the bottom of the trench is formed. Here, the semiconductor region works as an electric field relaxation region for relaxing the electric field in the bottom of the trench; in order to actually work the above as the electric field relaxation region however, it is necessary to activate the conductivity type dopant introduced to the bottom of the trench. For this purpose, thermal processing is performed on the silicon carbide substrate; however, the temperature of the thermal processing for activating the conductivity type dopant introduced to the silicon carbide substrate is high about 1800° C. and therefore, there is a fear of evaporating the silicon forming the silicon carbide substrate from the same substrate during the thermal processing.

Taking the above into consideration, before the thermal processing for activating the conductivity type dopant, the front surface and the rear surface of the silicon carbide substrate including the inside of the trench are covered with a heat resistant film made of, for example, a carbon film. As the result, even when the high-temperature thermal processing for activating the conductivity type dopant is performed, the silicon can be avoided from evaporating from the silicon carbide substrate because the front surface and the rear surface of the silicon carbide substrate are covered with a heat resistant film.

After the heat resistant film is removed, hydrogen annealing ("annealing round") for rounding the corner of the trench is performed. The process of removing the heat resistant film, however, is performed in an ashing process by oxygen plasma; therefore, when the heat resistant film is removed, an insulating film (oxide film) is formed on the front surface of the silicon carbide substrate including the inner wall of the trench. The inventor et al. has found that the hydrogen annealing performed with the insulating film formed there increases the surface roughness on the surface of the silicon carbide substrate including the inner wall of the trench. This is supposedly caused by uneven film thickness of the insulating film formed by the oxygen plasma ashing. In other words, during the hydrogen annealing thereafter, a part of the insulating film is evaporated; because of the uneven film thickness of the insulating film, the silicon carbide substrate is exposed from the surface of the insulating film in a thin area of the same film; on the other hand, the silicon carbide substrate is not exposed from the surface in a thick area of the insulating film. As the result, silicon is easily evaporated from the surface exposed area of the silicon carbide substrate, while it is hardly evaporated from the surface not-exposed area. According to this, evaporation degree of the silicon varies depending on whether the exposure or non-exposure of the surface of the silicon carbide substrate, which increases the surface roughness of the silicon carbide substrate.

In short, in the manufacturing process of the SiC power transistor, there is the process of removing the heat resistant film through the oxygen plasma just before performing the hydrogen annealing ("annealing round"), which makes the surface of the silicon carbide substrate including the inner wall of the trench rougher. Since the heat resistant film covering the silicon carbide substrate is required to activate the conductivity type dopant introduced to the bottom of the trench, the process of removing the heat resistant film should be necessarily before the hydrogen annealing. Therefore, some improvement is necessary to perform the hydrogen annealing ("annealing round") without increasing the roughness on the surface of the silicon carbide substrate. Then, the embodiment provides a way of performing the hydrogen annealing ("annealing round") without increasing the roughness on the surface of the silicon carbide substrate. Hereinafter, technical idea in the improved embodiment will be described.

Structure of Semiconductor Wafer

Figure 1A:
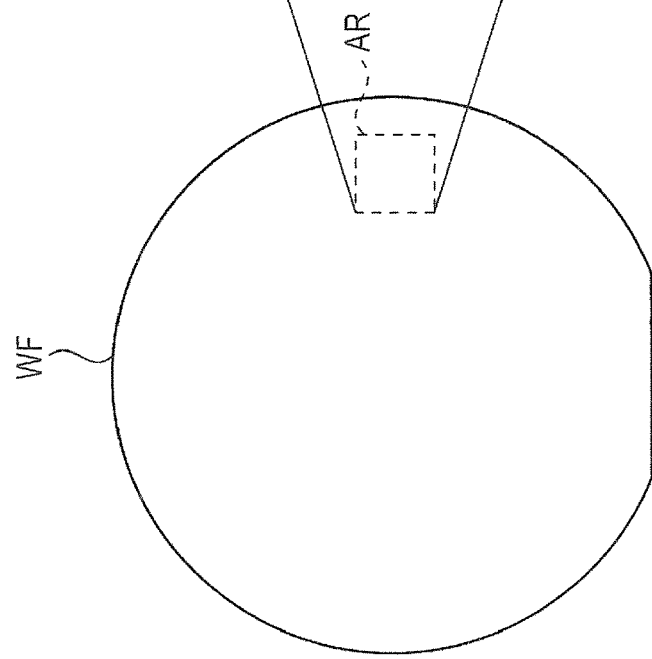

FIG. 1A is a view schematically showing an outer shape of a semiconductor wafer WF according to the embodiment, and FIG. 1B is an enlarged view showing an area AR of FIG. 1 in an enlarged way. At first, as shown in FIG. 1A, the semiconductor wafer WF in the embodiment has a substantially circular shape in plan view. As shown in FIG. 1B, for example, a plurality of chip regions CR are arranged in the area AR, a part of the semiconductor wafer WF, in a matrix shape (array shape) and the respective chip regions CR are divided by a scribe region BR. A SiC power transistor, for example, as a semiconductor element is formed in each of the chip regions CR. On the other hand, in the scribe region BR, any semiconductor element is not formed but works as a region for dicing the plural chip regions CR individually.

Figure 2:
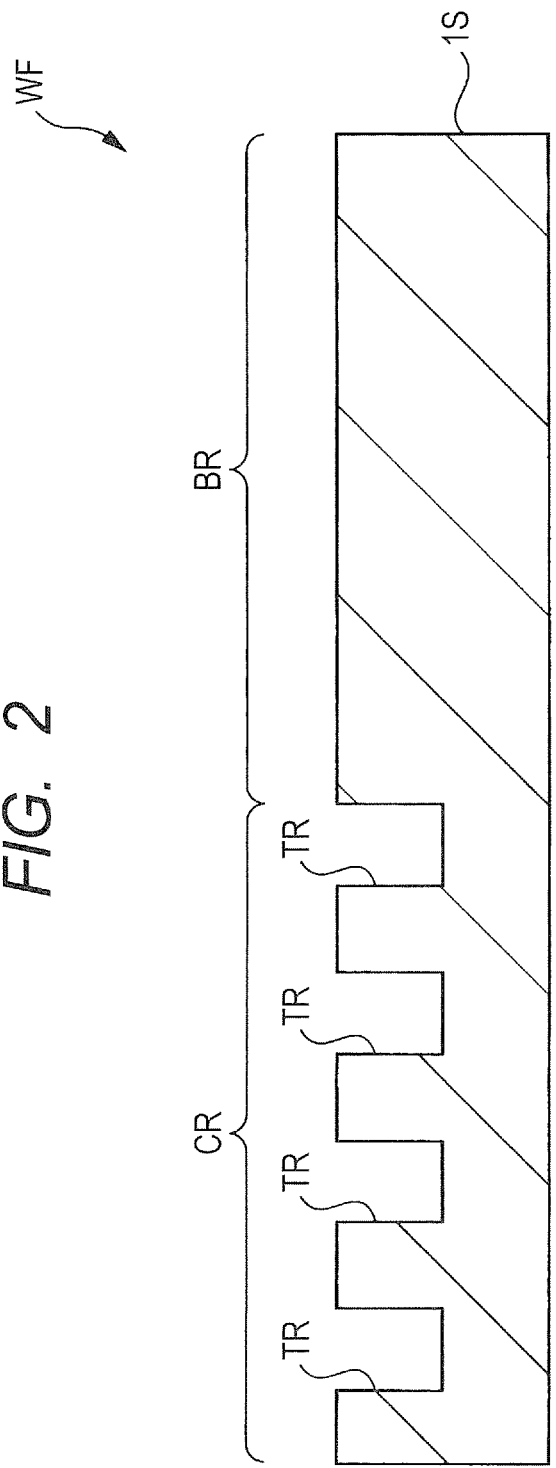
FIG. 2 is a view schematically showing a cross section of the semiconductor wafer.

FIG. 2 is a view schematically showing a part of the cross section of the semiconductor wafer WF. As shown in FIG. 2, a plurality of trenches TR are formed in the chip region CR of the semiconductor wafer WF. In the scribe region BR of the semiconductor wafer WF, any trench TR is not formed and the surface of the scribe region BR is flat.

Device Structure of Power Transistor

Figure 3:
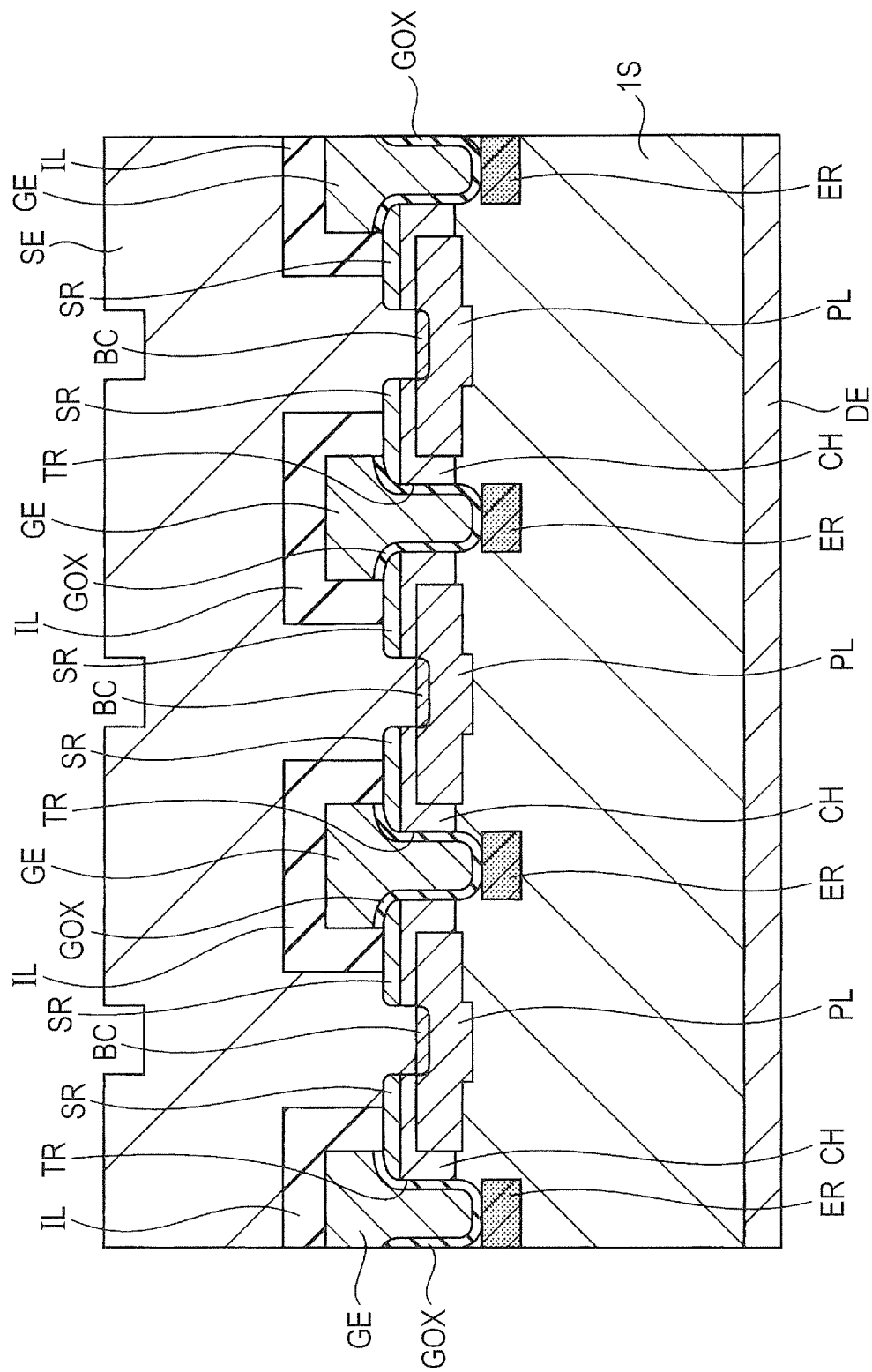
FIG. 3 is a cross-sectional view schematically showing a device structure of a SiC power transistor according to the embodiment.

Next, a device structure of the SiC power transistor formed in each of the chip regions CR will be described. FIG. 3 is a cross-sectional view schematically showing the device structure of the SiC power transistor in the embodiment. As shown in FIG. 3, the SiC power transistor in the embodiment includes, for example, a silicon carbide substrate 1S containing SiC, and a drift layer (epitaxial layer) formed of n-type semiconductor layer is formed on the silicon carbide substrate 1S. In FIG. 3, the drift layer, because of being formed integrally with the silicon carbide substrate 1S, is not illustrated here. The silicon carbide substrate 1S (including the drift layer) works as a drain region of the power transistor. Especially, the drift layer has a function of securing a withstand voltage between the drain region and a source region described later and in the embodiment, the drift layer is formed by a silicon carbide (SiC) as a wide bandgap semiconductor having a wider bandgap than the silicon. The dielectric breakdown intensity of the SiC is larger than that of the silicon (Si); therefore, according to the embodiment, the drift layer for securing the withstand voltage can be thinned more than in the case of using the silicon and the dopant concentration of the drift layer can be enhanced. As the result, an increase in the on resistance caused by the drift layer can be suppressed. In short, according to the embodiment, the silicon carbide substrate 1S (including the drift layer) is formed of SiC, hence to improve the withstand voltage and decrease the on resistance.

As shown in FIG. 3, a channel layer CH made of a p-type semiconductor layer is formed in the drift layer. This channel layer CH is an area for forming an inversion layer (n-type semiconductor layer). A source region SR made of an n-type semiconductor region is formed on the surface of the channel layer CH. A trench TR penetrating the source region SR and the channel layer CH to arrive at the drift layer is formed and a gate insulating film GOX made of, for example, a silicon oxide film covers the inner wall of the trench TR across a part of the top surface of the source region SR. Then, a gate electrode GE made of, for example, a polysilicon film is formed to be embedded in the trench TR through this gate insulating film GOX, and further, this gate electrode GE has a protruding portion that protrudes from the trench TR over a part of the source region SR. The gate electrode GE in the embodiment has a so-called "T gate structure". Further, as shown in FIG. 3, an electric field relaxation region ER made of a p-type semiconductor region is formed in the bottom of the trench TR. According to this, this embodiment can suppress the electric field concentration in the bottom of the trench TR.

Continuously, as shown in FIG. 3, the other end opposite to one end of the source region SR in contact with the trench TR makes contact with a groove arriving at the channel layer CH and in the bottom of this groove, a body contact region BC is formed, which is made of the p-type semiconductor region having a higher dopant concentration than the channel layer CH. Further, a p-type semiconductor layer PL is formed in contact with the body contact region BC, the channel layer CH, and the silicon carbide substrate 1S (drift layer). The p-type semiconductor layer PL does not always have to keep contact with the body contact region BC and the channel layer CH; for example, from a viewpoint of another different cross section from FIG. 3, the p-type semiconductor layer PL can be formed to be out of contact with the body contact region BC and the channel layer CH.

As shown in FIG. 3, an interlayer insulating film IL made of, for example, a silicon oxide film is formed to cover the protruding portion of the gate electrode GE. Then, a source electrode SE is formed to cover this interlayer insulating film IL, into contact with the source region SR and the body contact region BC. As the result, the source region SR and the body contact region BC are electrically coupled through the source electrode SE. The body contact region BC has a function of securing ohmic contact with the source electrode SE and the channel layer CH and through the body contact region BC, the source electrode SE and the channel layer CH are electrically coupled.

Therefore, the same potential is supplied to the source region SR and the channel layer CH, which can suppress the on operation of a parasitic bipolar transistor formed by the source region SR as the n-type semiconductor region, the channel layer CH as the p-type semiconductor layer, and the drift layer as the n-type semiconductor layer. This is because there is no potential difference between the base and the emitter of the parasitic bipolar transistor, with the source region SR and the channel layer CH electrically coupled with the same potential; therefore, the on operation of the parasitic bipolar transistor can be suppressed.

The trench gate type SiC power transistor thus constituted according to the embodiment forms an inversion layer (n-type semiconductor region) in the channel layer CH in contact with the side surface of the trench TR, by applying a gate voltage of a threshold voltage and more to the gate electrode GE. According to this, the source region SR and the drift layer (drain region) are electrically coupled through the inversion layer and when there is a potential difference between the source region SR and the drain region, electrons flow from the source region SR to the drift layer passing through the inversion layer. In other words, current flows from the drift layer to the source regions SR through the inversion layer. When the gate voltage of the threshold voltage and more is applied to the gate electrode GE of the SiC power transistor, the SiC power transistor turns on. On the other hand, when a voltage not more than the threshold voltage is applied to the gate electrode GE of the SiC power transistor, the inversion layer formed in the channel layer CH disappears, to make the source region SR and the drift layer non-conductive. As the result, the SiC power transistor turns off. As mentioned above, the SiC power transistor can be turned on and off by varying the gate voltage applied to the gate electrode GE of the SiC power transistor.

Here, the threshold voltage for forming the inversion layer depends on the film thickness of the gate insulating film GOX formed on the side surface of the trench TR. In other words, a portion of the gate insulating film GOX formed on the side surface of the trench TR facing the channel layer CH has a function of adjusting the threshold voltage and the film thickness of the gate insulating film GOX determines the threshold voltage. According to this, the film thickness of the gate insulating film GOX formed on the side surface of the trench TR facing the channel layer CH is determined by the threshold voltage for forming the inversion layer. As mentioned above, the power transistor according to the embodiment is formed.

In the SiC power transistor according to the embodiment, for example, as shown in FIG. 3, the edge portion (corner) of the trench TR having the gate electrode GE formed there is shaped roundish. According to this, the power transistor in the embodiment can suppress the electric field concentration in the vicinity of the edge portion of the trench TR. As the result, the power transistor in the embodiment can suppress the breakdown of the gate insulating film with a lower voltage than a design value.

Further, the SiC power transistor according to the embodiment can reduce the surface roughness of the inner wall of the trench TR as the result of consideration taken in the manufacturing method of a semiconductor device described later. Specifically, according to the embodiment, the surface roughness of the inner wall of the trench TR can be formed at 0.2 nm to 0.3 nm. This contributes to decrease of the surface roughness in the channel region formed on the side wall of the trench TR. As the result, the SiC power transistor according to the embodiment can suppress the electron scattering caused by the surface roughness (concave-convex shape), thereby suppressing the reduction of electron mobility. According to the embodiment, the performance of the SiC power transistor can be improved.

Manufacturing Method of Semiconductor Device

The SiC power transistor (semiconductor device) in the embodiment is constituted as mentioned above and the manufacturing method thereof will be, hereinafter, described with reference to the drawings.

Figure 4:
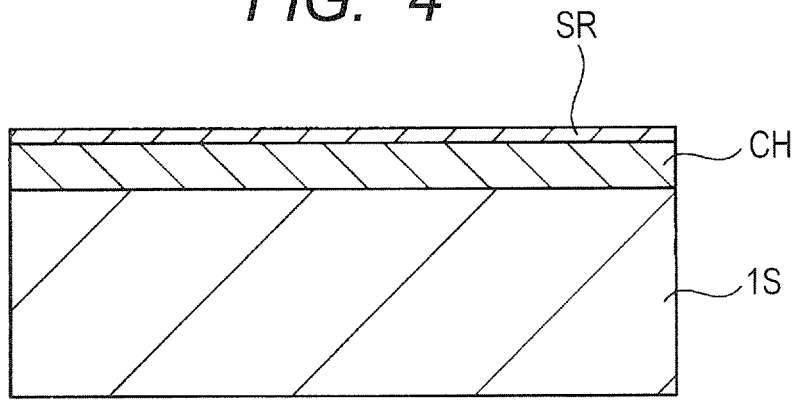
FIG. 4 is a cross-sectional view showing a manufacturing process of a semiconductor device.

As shown in FIG. 4, there is prepared a silicon carbide substrate 1S made of SiC with the drift layer as the n-type semiconductor layer formed. The channel layer CH as the p-type semiconductor layer is formed in the drift layer, for example, according to the photolithography and the ion implantation. Then, the source region SR as the n-type semiconductor region is formed on the surface of the channel layer CH, according to the photolithography and the ion implantation.

Figure 5:
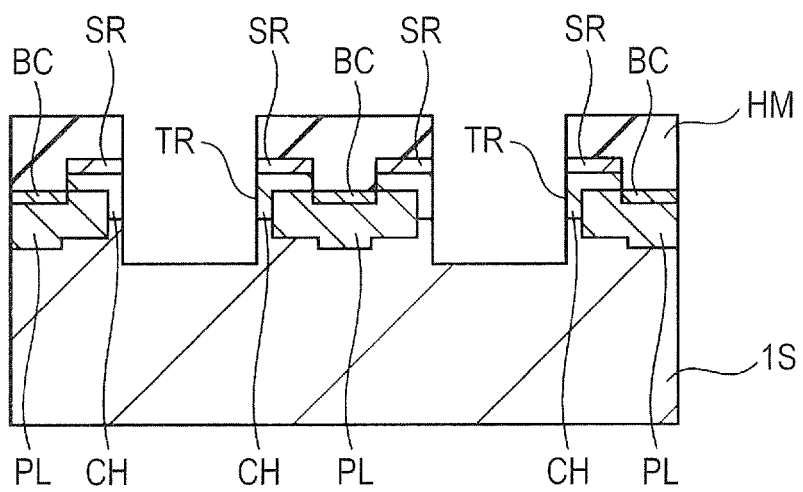
FIG. 5 is a cross-sectional view showing the manufacturing process of a semiconductor device following FIG. 4.

Continuously, as shown in FIG. 5, a groove which penetrates the source region SR to arrive at the channel layer CH is formed, according to the photolithography and the etching, and the body contact region BC as the p-type semiconductor region having a higher dopant concentration than the channel layer CH is formed in the bottom surface of the groove, for example, according to the photolithography and the ion implantation. Further, according to the photolithography and the ion implantation, the p-type semiconductor layer PL shown in FIG. 5 is also formed.

Thereafter, a hard mask film HM is formed on the surface of the silicon carbide substrate 1S having the body contact region BC and the source region SR formed, for example, according to the Chemical Vapor Deposition (CVD). Then, according to the photolithography, this hard mask film HM is patterned, and thereafter, according to the etching with this hard mask film HM used as a mask, the trench TR penetrating the source region SR and the channel layer CH to arrive at the drift layer is formed.

Figure 6:
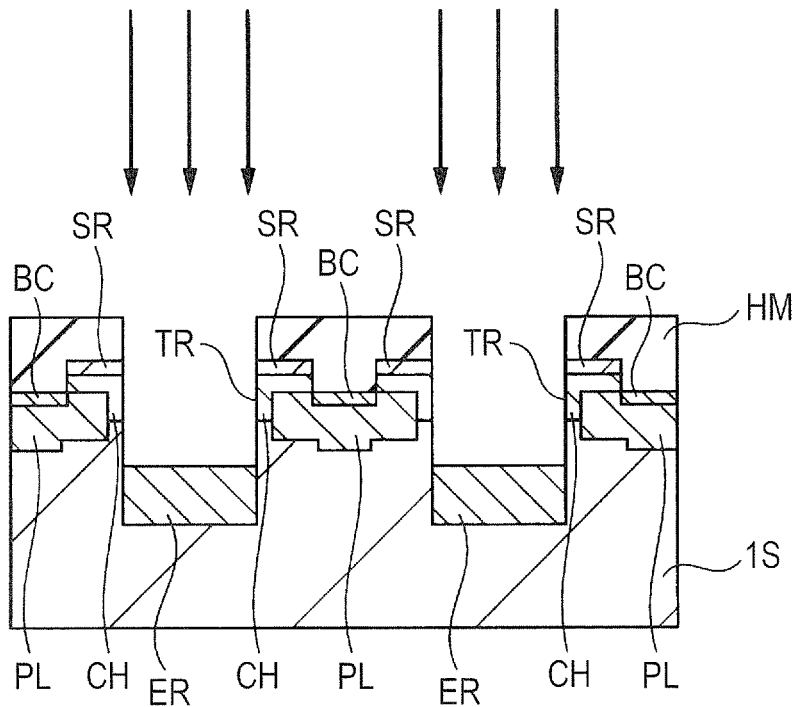
FIG. 6 is a cross-sectional view showing the manufacturing process of a semiconductor device following FIG. 5.
Figure 7:
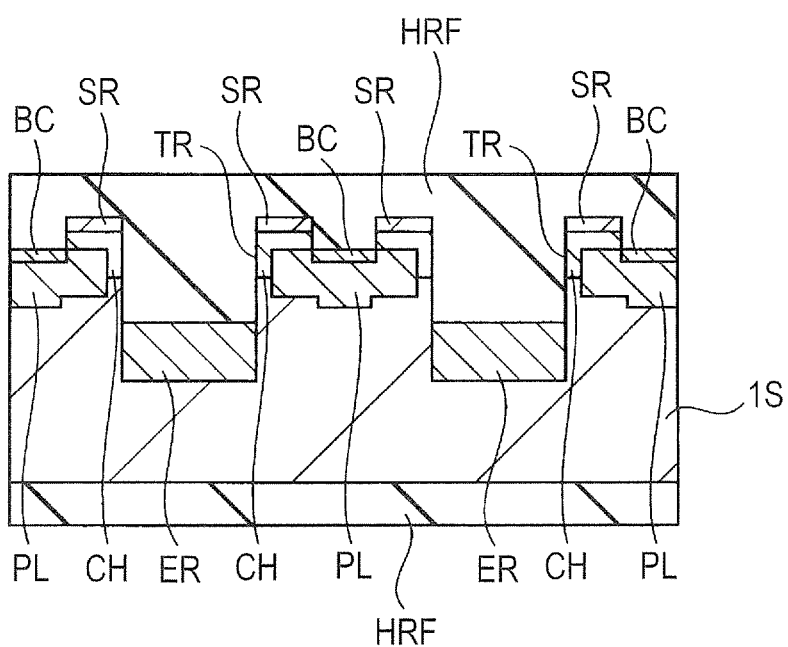
FIG. 7 is a cross-sectional view showing the manufacturing process of a semiconductor device following FIG. 6.

As shown in FIG. 6, according to the ion implantation with the hard mask film HM used as a mask, for example, the p-type dopant (conductivity type dopant) typified by aluminum is introduced to the bottom of the trench TR, to form an electric field relaxation region ER. As shown in FIG. 7, a heat resistant film HRF containing carbon is formed to bury the trench TR and cover the surface of the silicon carbide substrate 1S. Similarly, the heat resistant film HRF containing carbon is formed on the rear surface of the silicon carbide substrate 1S. This heat resistant film HRF is formed by, for example, a carbon film and the carbon film can be formed, for example, according to the sputtering. Alternatively, the heat resistant film HRF is not restricted to this but can be formed by, for example, a baked processed resist film.

Figure 8:
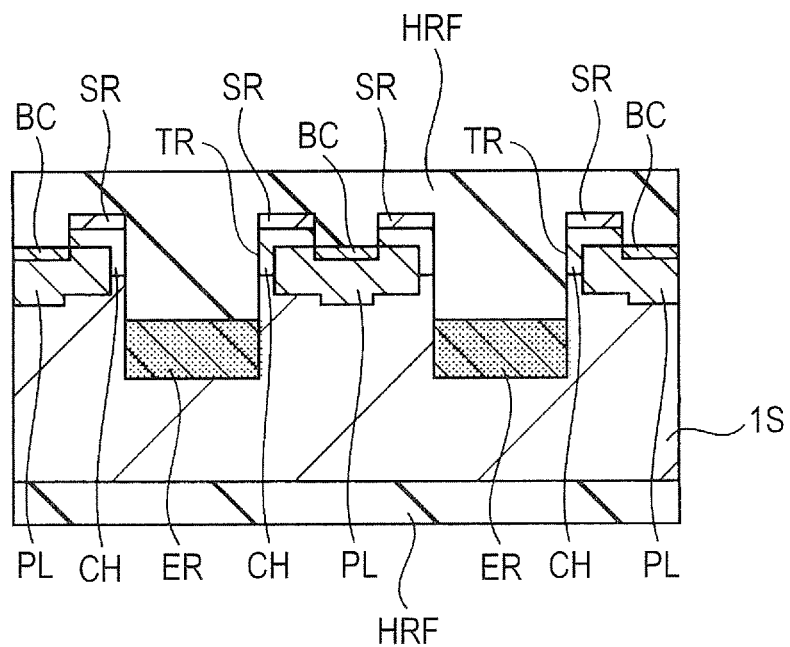
FIG. 8 is a cross-sectional view showing the manufacturing process of a semiconductor device following FIG. 7.

Then, as shown in FIG. 8, the thermal processing is performed on the silicon carbide substrate 1S to activate the conductivity type dopant introduced to the bottom of the trench TR. Specifically, the silicon carbide substrate 1S is heated at a temperature of, for example, 1800° C. According to this, the conductivity type dopant introduced to the electric field relaxation region ER is activated. As shown in FIG. 8, the front surface and the rear surface of the silicon carbide substrate 1S are covered with the heat resistant film HRF; therefore, evaporation of the silicon (Si) included in the silicon carbide substrate 1S can be suppressed.

Figure 9:
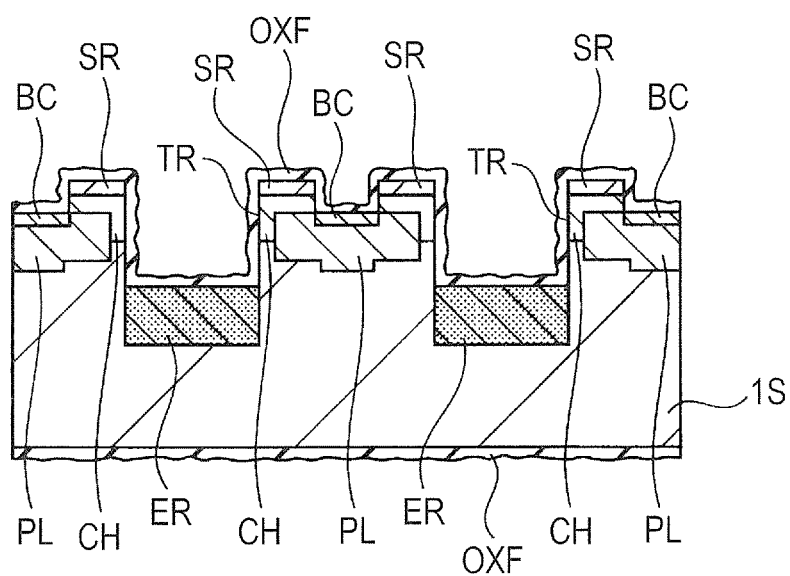
FIG. 9 is a cross-sectional view showing the manufacturing process of a semiconductor device following FIG. 8.

As shown in FIG. 9, the heat resistant film HRF is removed. Specifically, according to the plasma ashing using oxygen plasma, the heat resistant film HRF is removed. As the result of using the oxygen plasma, an oxide film OXF is formed on the front surface and the rear surface of the silicon carbide substrate 1S including the inner wall of the trench TR, as shown in FIG. 9. This oxide film OXF is made by, for example, an uneven film with the minimum film thickness 5 nm and more.

Figure 10:
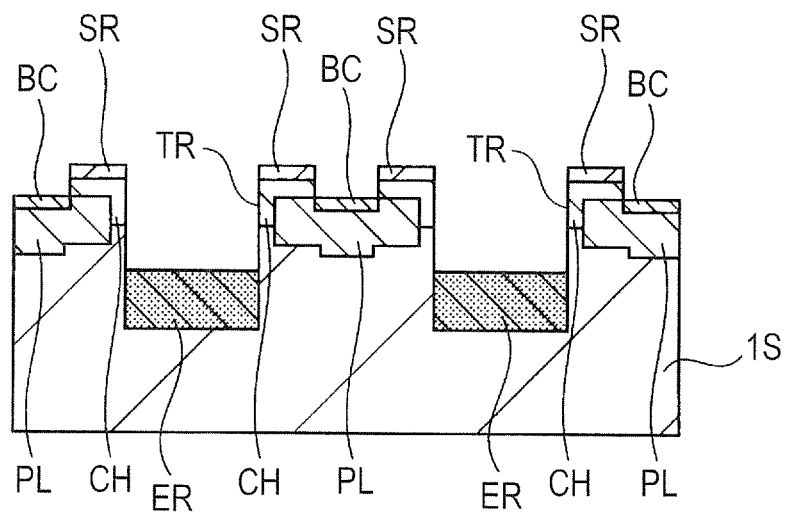
FIG. 10 is a cross-sectional view showing the manufacturing process of a semiconductor device following FIG. 9.

As shown in FIG. 10, the oxide film OXF formed on the front surface and the rear surface of the silicon carbide substrate 1S including the inner wall of the trench TR is removed. Specifically, according to the wet etching using, for example, hydrofluoric acid, the oxide film OXF is removed.

Figure 11:
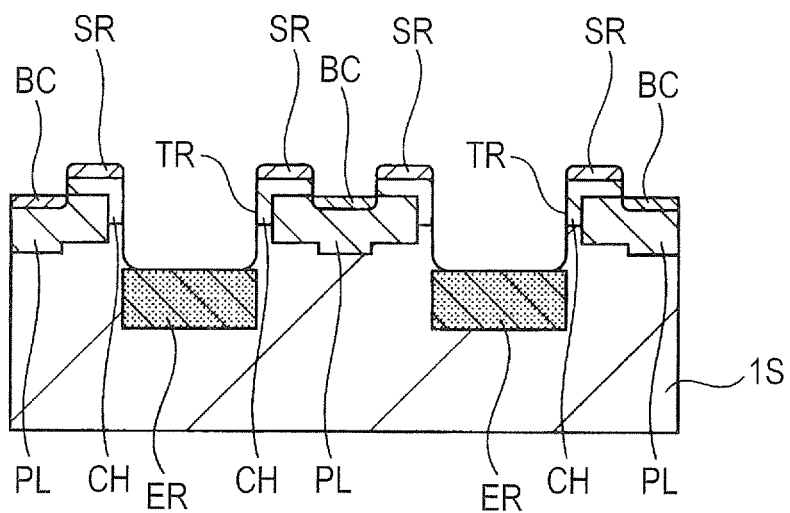
FIG. 11 is a cross-sectional view showing the manufacturing process of a semiconductor device following FIG. 10.

Then, as shown in FIG. 11, the hydrogen annealing is performed on the silicon carbide substrate 1S having the trenches TR formed. Specifically, the hydrogen annealing is performed, for example, at a temperature in the range of 1400° C. to 1600° C. inclusive. As the result, migration of SiC occurs in the edge portion (corner) of the trench TR, hence to round the edge portion of the trench TR as shown in FIG. 11. As mentioned above, the "annealing round" is realized by the hydrogen annealing.

Figure 12:
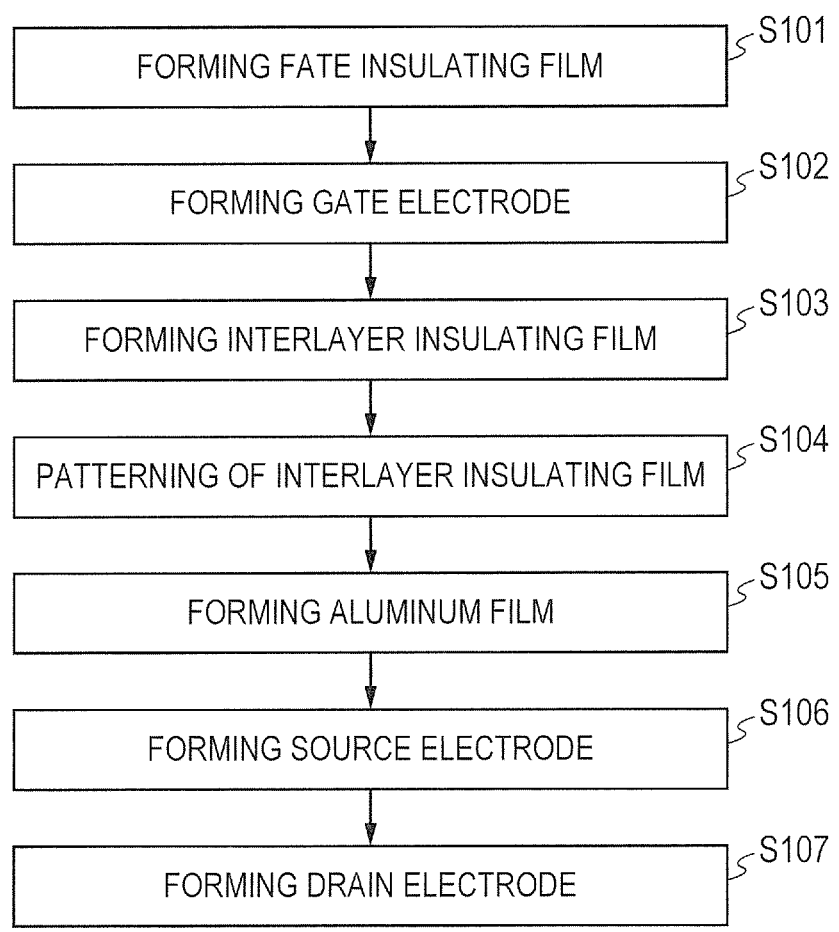
FIG. 12 is a flow chart showing the manufacturing process of a semiconductor device following FIG. 11.

The process later than this will be described based on the flow chart shown in FIG. 12.

At first, a gate insulating film made of an oxide film is formed on the inner wall of the trench, for example, according to the thermal oxidation method (S101).

Then, for example, according to the CVD, a polysilicon film is formed to bury the trench and cover the gate insulating film. Then, according to the photolithography and the etching, the polysilicon film is patterned. According to this, the gate electrode made of the polysilicon film can be formed (S102).

Continuously, an interlayer insulating film is formed to cover the gate electrode (S103). This interlayer insulating film is formed of, for example, a silicon oxide film. The interlayer insulating film is patterned according to the photolithography and etching, hence to form an opening portion (S104). This interlayer insulating film is formed to separate the gate electrode and the source electrode described later.

Next, a barrier conductor film (for example, TiN film) is formed on the surface of the interlayer insulating film having the opening portion formed, for example, according to the sputtering and a metal film is formed on this barrier conductor film. The metal film can be formed of, for example, an aluminum film or an aluminum alloy film (AiSi film) (S105).

Then, according to the photolithography and etching, the metal film and the barrier conductor film are patterned. As the result, for example, a source electrode (source pad) and a gate pad can be formed (S106). Further, for example, according to the sputtering, a drain electrode made of a metal film is formed on the rear surface of the silicon carbide substrate 1S (S107). As mentioned above, the SiC power transistor (semiconductor device) according to the embodiment can be manufactured.

Characteristic of the Embodiment

Next, a characteristic point in the embodiment will be described. For example, as shown in FIGS. 9 to 11, as the characteristic point, the hydrogen annealing is performed to round the edge portion of the trench TR after removing the oxide film OXF. According to the embodiment, without increasing the surface roughness of the silicon carbide substrate 1S, the edge portion of the trench TR can be rounded through the hydrogen annealing ("annealing round"). As the result, especially, while reducing the surface roughness of the channel region formed on the side wall of the trench TR, the edge portion of the trench TR can be rounded. Therefore, the embodiment can suppress the electron scattering caused by the surface roughness (concave-convex shape), hence to suppress the deterioration of electron mobility and the electric field concentration in the vicinity of the edge portion of the trench TR. As the result, the embodiment can improve the reliability and the performance of the SiC power transistor.

For example, in the manufacturing process of the SiC power transistor, after introducing the conductivity type dopant to the silicon carbide substrate 1S, activation annealing at a high temperature is performed there to activate the introduced conductivity type dopant. To activate the conductivity type dopant introduced to the silicon carbide substrate 1S, however, for example, thermal processing at 1800° C. is necessary and the thermal processing decomposes the silicon carbide forming the silicon carbide substrate 1S and may evaporate the silicon. In other words, for example, the thermal processing at much higher temperature is required to activate the conductivity type dopant introduced to the silicon carbide substrate 1S than to activate the conductivity type dopant introduced to the silicon substrate. The thermal processing at a high temperature decomposes the silicon carbide forming the silicon carbide substrate 1S. In the SiC power transistor using the silicon carbide substrate 1S, since the thermal processing at a high temperature is necessary to activate the conductivity type dopant introduced to the silicon carbide substrate 1S, there is a fear of evaporating the silicon in accordance with the decomposition of the silicon carbide.

To suppress the evaporation of the silicon caused by the decomposition of the silicon carbide in the high-temperature thermal processing, the heat resistant film HRF made of a carbon film is formed to cover the front surface and the rear surface of the silicon carbide substrate 1S, for example, as shown in FIG. 7. In this case, the heat resistant film HRF to cover the silicon carbide substrate 1S suppresses the evaporation of the silicon. After finishing the high-temperature thermal processing to activate the conductivity type dopant introduced to the silicon carbide substrate 1S, the heat resistant film HRF becomes unnecessary and is removed. Here, for example, the plasma ashing using oxygen plasma is used to remove the heat resistant film HRF. As the result, for example, as shown in FIG. 9, the oxide film OXF is formed on the surface of the silicon carbide substrate 1S from which the heat resistant film HRF is removed.

The inventor et al. has found that when the oxide film OXF is on the surface of the silicon carbide substrate 1S because of the removal of the heat resistant film HRF, the hydrogen annealing performed later to round the edge portion of the trench TR increases the surface roughness of the inner wall of the trench TR. With respect to this point, the inventor et al. has examined carefully and found that the oxide film OXF formed on the surface of the silicon carbide substrate 1S caused by the oxygen plasma used for removing the heat resistant film HRF is much thicker (for example, the average film thickness is about 5 nm) than the natural oxide film and that the oxide film OXF is an uneven film in thickness. The inventor et al. has found out that the increasing surface roughness of the inner wall of the trench TR is mainly caused by the oxide film OXF uneven and much thicker than the natural oxide film, formed on the surface of the silicon carbide substrate 1S. According to the founding by the inventor et al., when the uneven oxide film OXF with much larger film thickness than the natural oxide film is formed on the surface of the silicon carbide substrate 1S, a part of the oxide film OXF evaporates in the hydrogen annealing and the surface of the silicon carbide substrate 1S is exposed in a thin portion of the oxide film OXF, due to the unevenness of the film thickness. On the other hand, the surface of the silicon carbide substrate 1S is not exposed in a thick portion of the oxide film OXF. As the result, silicon easily evaporates from the exposed portion of the silicon carbide substrate 1S; while, it hardly evaporates from the not-exposed portion thereof. Thus, the degree of silicon evaporation varies depending on whether the surface of the silicon carbide substrate 1S is exposed or not, which increases the surface roughness of the silicon carbide substrate 1S. When the hydrogen annealing is performed with the uneven oxide film OXF generated by the removal of the heat resistant film HRF formed there, the surface roughness of the silicon carbide substrate 1S gets larger.

Then, the inventor et al. has arrived at the characteristic point of the embodiment, based on the above founding; that is, the hydrogen annealing with the uneven oxide film OXF generated by the removal of the heat resistant film HRF formed there increases the surface roughness of the silicon carbide substrate 1S. Through the above-mentioned founding, the inventor et al. has arrived at the technical idea that the hydrogen annealing for rounding the edge portion of the trench TR is performed after removing the uneven oxide film OXF generated by the removal of the heat resistant film HRF, for example, as shown in FIGS. 9 to 11. The technical idea (characteristic) in the embodiment is: (1) the thermal processing at a high temperature is required to activate the conductivity type dopant introduced to the silicon carbide substrate 1S, (2) the heat resistant film HRF is required to suppress evaporation of the silicon in the activation annealing, (3) the uneven oxide film OXF generated by the removal of the heat resistant film HRF is formed. Based on the above foundlings, the technical idea (characteristic) of the embodiment is to be arrived at, by such recognition as (4): in the hydrogen annealing, with the uneven oxide film OXF formed there, the surface roughness of the silicon carbide substrate 1S gets larger. According to the above technical idea (characteristic), it is possible to round the edge portion of the trench TR through the hydrogen annealing, without increasing the surface roughness of the silicon carbide substrate 1S. Further, it is possible to shape the edge portion of the trench TR round while decreasing the surface roughness, especially, in the channel region formed on the side surface of the trench TR. This can suppress the electron scattering caused by the surface roughness (concave-convex shape), the deterioration of the electron mobility, and the electric field concentration in the vicinity of the edge portion of the trench TR. As the result, according to the technical idea (characteristic) of the embodiment, it is possible to improve the reliability and the performance of the SiC power transistor.

Particularly, in the embodiment, the wet etching, for example, using the hydrofluoric acid is used as a method of removing the uneven oxide film OXF generated by the removal of the heat resistant film HRF. According to the embodiment, it is possible to remove the uneven oxide film OXF without giving the etching damage to the silicon carbide substrate 1S.

For example, when the hydrogen annealing is performed with the oxide film OXF generated by the removal of the heat resistant film HRF formed there, the surface roughness of the silicon carbide substrate 1S is about 1.0 nm to 1.3 nm. On the contrary, when the hydrogen annealing according to the technical idea of the embodiment is performed with the oxide film OXF generated by the removal of the heat resistant film HRF removed therefrom, the surface roughness of the silicon carbide substrate 1S is about 0.2 nm to 0.3 nm. As mentioned above, according to the technical idea (characteristic) in the embodiment; that is, the hydrogen annealing is performed after removing the oxide film OXF generated by the removal of the heat resistant film HRF, it is found that the surface roughness of the silicon carbide substrate 1S can be much smaller than in the technique of performing the hydrogen annealing with the oxide film OXF formed. The above technical idea (characteristic) in the embodiment which can decrease the surface roughness of the silicon carbide substrate 1S, is very useful in the hydrogen annealing for rounding the edge portion of the trench TR, from the viewpoint of suppressing the electric field concentration in the edge portion of the trench TR.

MODIFIED EXAMPLE 1

In the embodiment, for example, the case of using the wet etching with the hydrofluoric acid has been described as the method of removing the uneven oxide film OXF generated by the removal of the heat resistant film HRF. In the modified example 1, a case of using, for example, dry etching will be described as the method of removing the above oxide film OXF.

Figure 13:
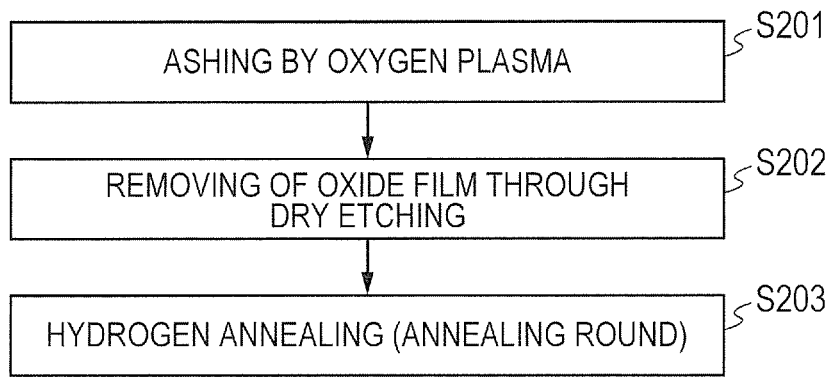
FIG. 13 is a flow chart showing a manufacturing process of a semiconductor device according to a modified example 1.

FIG. 13 is a flow chart for use in describing the flow of the process for removing the uneven oxide film generated by the removal of the heat resistant film in the modified example 1.

In FIG. 13, at first, the heat resistant film formed to cover the silicon carbide substrate is removed (S201). The uneven oxide film generated by the removal of the heat resistant film is formed on the surface of the silicon carbide substrate. Specifically, according to the plasma ashing using the oxygen plasma, the heat resistant film is removed. As the result of using the oxygen plasma, the uneven oxide film is formed on the front surface and the rear surface of the silicon carbide substrate including the inner wall of the trench. The average film thickness of this oxide film is 5 nm and more.

Continuously, the oxide film formed on the front surface and the rear surface of the silicon carbide substrate including the inner wall of the trench is removed. Specifically, for example, according to the dry etching using etch gas including one of $SF_6$, $NF_3$, and $CF_4$, the oxide film is removed from the surface of the silicon carbide substrate (S202).

Then, the hydrogen annealing is performed on the silicon carbide substrate having the trenches formed (S203). Specifically, the hydrogen annealing is performed at a temperature, for example, in the range of 1400° C. to 1600° C. inclusive. As the result, migration of SiC occurs in the edge portion (corner) of the trench, hence to round the edge portion of the trench. As mentioned above, the "annealing round" is realized by the hydrogen annealing.

The modified example 1 can also round the edge portion of the trench through the hydrogen annealing, without increasing the surface roughness of the silicon carbide substrate. Further, the modified example 1 can shape the edge portion of the trench round, while decreasing the surface roughness of the channel region formed on the side wall of the trench. According to this, the modified example 1 can also suppress the electron scattering caused by the surface roughness (concave-convex shape), the deterioration of the electron mobility, and the electric field concentration in the vicinity of the edge portion of the trench. According to the modified example 1, it is possible to improve the reliability and the performance of the SiC power transistor.

Particularly, in the modified example 1, the oxide film can be removed according to the dry etching using the etch gas including one of $SF_6$, $NF_3$, and $CF_4$, through the consecutive processing following the removal of the heat resistant film according to the plasma ashing using the oxygen plasma. Therefore, according to the modified example 1, it is possible to perform the removal process of the heat resistant film and the removal process of the oxide film consecutively, without open in the air, thereby simplifying the manufacturing process.

MODIFIED EXAMPLE 2

In the modified example 2, a case of using the hydrogen annealing ("annealing round") for rounding the edge portion of the trench at a lower temperature will be described as the method of removing the uneven oxide film OXF generated by the removal of the heat resistant film HRF.

Figure 14:
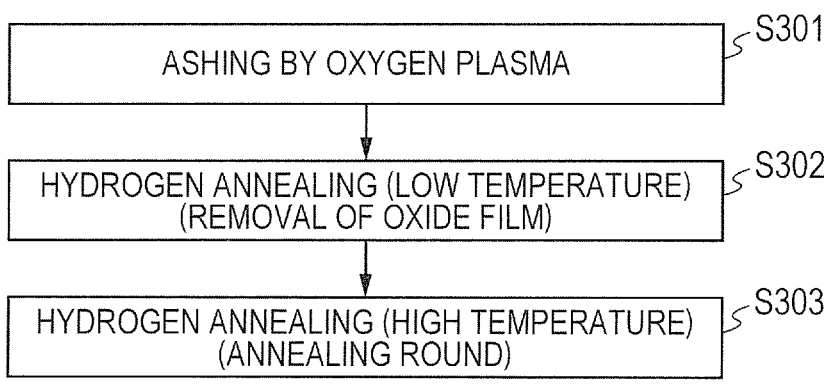
FIG. 14 is a flow chart showing a manufacturing process of a semiconductor device according to a modified example 2.

FIG. 14 is a flow chart for use in describing the flow of the process of removing the uneven oxide film generated by the removal of the heat resistant film, according to the modified example 2.

In FIG. 14, at first, the heat resistant film formed to cover the silicon carbide substrate is removed (S301). Here, the uneven oxide film generated by the removal of the heat resistant film is formed on the surface of the silicon carbide substrate. Specifically, according to the plasma ashing using the oxygen plasma, the heat resistant film is removed. As the result of using the oxygen plasma, the uneven oxide film is formed on the front surface and the rear surface of the silicon carbide substrate including the inner wall of the trench. The average film thickness of this oxide film is 5 nm and more.

Continuously, the oxide film formed on the front surface and the rear surface of the silicon carbide substrate including the inner wall of the trench is removed. Specifically, according to the hydrogen annealing at a temperature (low temperature), for example, in the range of 1100 OC to 1300° C.

inclusive, the oxide film is removed from the surface of the silicon carbide substrate (S302).

Thereafter, the high-temperature hydrogen annealing is performed on the silicon carbide substrate having the trenches formed (S303). Specifically, the high-temperature hydrogen annealing is performed, for example, in the range of 1400° C. to 1600° C. inclusive. As the result, migration of SiC occurs in the edge portion (corner) of the trench, hence to round the edge portion of the trench. As mentioned above, the "annealing round" is realized by the high-temperature hydrogen annealing. In this example, the uneven oxide film generated by the removal of the heat resistant film is removed through the hydrogen annealing at a low temperature (1100° C. to 1300° C. inclusive), and then, the "annealing round" for rounding the edge portion of the trench is performed through the hydrogen annealing at a high temperature (1400° C. to 1600° C. inclusive). As the result, this modified example 2 can perform the "annealing round" according to the high-temperature hydrogen annealing, in the consecutive processing following the low-temperature hydrogen annealing for removing the oxide film. Therefore, according to the modified example 2, it is also possible to perform the process of removing the oxide film and the process of rounding the edge portion of the trench consecutively, without open in the air, hence to simplify the manufacturing process of the SiC power transistor.

The modified example 2 can also round the edge portion of the trench through the high-temperature hydrogen annealing, without increasing the surface roughness of the silicon carbide substrate. Further, the modified example 2 can shape the edge portion of the trench round, while decreasing the surface roughness of the channel region formed on the side wall of the trench. According to this, also the modified example 1 can suppress the electron scattering caused by the surface roughness (concave-convex shape), the deterioration of the electron mobility, and the electric field concentration in the vicinity of the edge portion of the trench. According to the modified example 2, it is also possible to improve the reliability and the performance of the SiC power transistor.

MODIFIED EXAMPLE 3

In the modified example 3, a case of using the non-oxide processing, instead of the plasma ashing using the oxygen plasma, will be described as the method of removing the heat resistant film.

Figure 15:
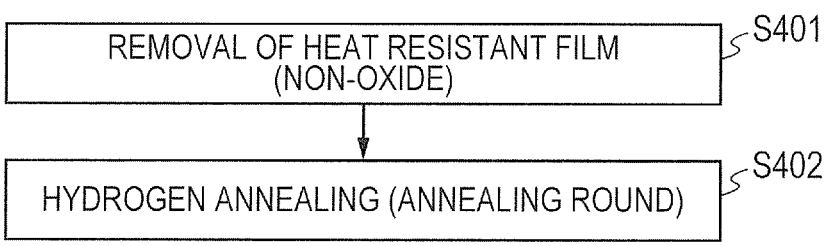
FIG. 15 is a flow chart showing a manufacturing process of a semiconductor device according to a modified example 3.

FIG. 15 is a flow chart for use in describing the flow of the process for performing the hydrogen annealing after the removal process of the heat resistant film, according to the modified example 3.

In FIG. 15, at first, the heat resistant film formed to cover the silicon carbide substrate is removed (S401). Here, as the method of removing the heat resistant film, the non-oxide processing is adopted in the modified example 3, instead of the plasma ashing using the oxygen plasma. Specifically, in the modified example 3, the plasma ashing using the hydrogen plasma or the nitrogen plasma is used as the method of removing the heat resistant film. According to this, in the modified example 3, since the oxygen plasma is not used, any oxide film is not formed on the surface of the silicon carbide substrate, even when performing the removal process of the heat resistant film.

Then, the hydrogen annealing is performed on the silicon carbide substrate having the trenches formed (S402). Specifically, the hydrogen annealing is performed at a temperature, for example, in the range of 1400° C. to 1600° C. inclusive. As the result, migration of SiC occurs in the edge portion (corner) of the trench, hence to round the edge portion of the trench. As mentioned above, the "annealing round" is realized through the hydrogen annealing.

As mentioned above, the modified example 3 adopts the plasma ashing using the hydrogen plasma or the nitrogen plasma as the process of removing the heat resistant film, instead of the plasma ashing using the oxygen plasma. Since the modified example 3 does not use the oxygen plasma, any oxide film is not formed on the surface of the silicon carbide substrate even when performing the removal process of the heat resistant film. In short, the technical idea of the modified example 3 is the spirit for preventing the uneven oxide film itself generated by the removal of the heat resistant film. Considering that the uneven oxide film is formed on the surface of the silicon carbide substrate, caused by the oxygen plasma, in the case of using the plasma ashing using the oxygen plasma, as the process of removing the heat resistance film, the modified example 3 adopts the plasma ashing using the hydrogen plasma or nitrogen plasma. As mentioned above, the technical idea in the modified example 3 is not to remove the uneven oxide film generated by performing the process of removing the heat resistant film but to prevent the oxide film itself from forming even when the process of removing the heat resistant film is performed. In other words, the technical idea in the modified example 3 is not to form the oxide film on the surface of the silicon carbide substrate, paying attention to the process itself for removing the heat resistant film. According to the technical idea in the modified example 3, the oxide film itself is not formed and therefore, the process of removing the oxide film is unnecessary. As the result, the modified example 3 can simply the manufacturing process of the SiC power transistor.

The modified example 3 can also round the edge portion of the trench through the high-temperature hydrogen annealing, without increasing the surface roughness of the silicon carbide substrate. Further, the modified example 3 can also shape the edge portion of the trench round, while decreasing the surface roughness of the channel region formed on the side wall of the trench. According to this, the modified example 3 can also suppress the electron scattering caused by the surface roughness (concave-convex shape), the deterioration of the electron mobility, and the electric field concentration in the vicinity of the edge portion of the trench. According to the modified example 3, it is also possible to improve the reliability and the performance of the SiC power transistor.

As set forth hereinabove, the invention made by the inventor et al. has been described concretely based on the embodiment; however, the invention is not restricted to the above embodiments but it is needless to say that various modifications can be made without departing from the spirit.

What is claimed is:

1. A manufacturing method of a semiconductor device, comprising the following steps of:
   (a) preparing a silicon carbide substrate;
   (b) forming a trench on a surface of the silicon carbide substrate;
   (c) introducing conductivity type dopant to a bottom of the trench;
   (d) after the step (c), forming a heat resistant film to bury the trench and cover the surface of the silicon carbide substrate, containing carbon;
   (e) after the step (d), performing thermal processing to activate the conductivity type dopant;
   (f) after the step (e), removing the heat resistant film;

(g) removing an insulating film formed on the surface of the silicon carbide substrate including an inner wall of the trench through the step (f); and (h) after the step (g), performing hydrogen annealing on the silicon carbide substrate where the trench is formed.

2. The method according to claim 1, wherein in the step (f), oxygen plasma is used.

3. The method according to claim 1, wherein the hydrogen annealing is performed at a temperature from 1400° C. to 1600° C. inclusive.

4. The method according to claim 1, wherein film thickness of the insulating film is 5 nm and more.

5. The method according to claim 1, wherein the step (g) is a wet etching step.

6. The method according to claim 5, wherein hydrofluoric acid is used in the step (g).

7. The method according to claim 1, wherein the step (g) is a dry etching step.

8. The method according to claim 7, wherein etch gas containing one of $SF_6$, $NF_3$, and $CF_4$ is used in the step (g).

9. The method according to claim 1,
wherein the step (g) is hydrogen annealing at a temperature from 1100° C. to 1300° C. inclusive, and
wherein the step (h) is hydrogen annealing at a temperature from 1400° C. to 1600° C. inclusive.

10. The method according to claim 1, wherein in the step (e), an electric field relaxation region is formed in a bottom of the trench.

11. The method according to claim 1, wherein in the step (h), an edge portion of the trench is rounded.

12. The method according to claim 1, wherein the conductivity type dopant introduced in the step (c) is p-type dopant.

13. The method according to claim 12, wherein the p-type dopant is aluminum.

* * * * *